United States Patent [19]

Shimazu

[11] Patent Number: 5,709,543

[45] Date of Patent: Jan. 20, 1998

[54] VERTICAL HEAT TREATMENT APPARATUS

[75] Inventor: Tomohisa Shimazu, Sagamihara, Japan

[73] Assignee: Tokyo Electron Limited, Tokyo-To, Japan

[21] Appl. No.: 706,530

[22] Filed: Sep. 4, 1996

[30] Foreign Application Priority Data

Sep. 6, 1995 [JP] Japan .................................. 7-254676

[51] Int. Cl.$^6$ ............................................. F27D 3/12
[52] U.S. Cl. ................................ 432/241; 432/5; 432/6; 432/253
[58] Field of Search .................................. 432/241, 152, 432/253, 5, 6

[56] References Cited

U.S. PATENT DOCUMENTS

| | | | |
|---|---|---|---|
| 4,721,459 | 1/1988 | Fitz | 432/241 |
| 5,310,339 | 5/1994 | Ushikawa | 432/253 |
| 5,330,352 | 7/1994 | Watanabe et al. | 432/253 |
| 5,567,152 | 10/1996 | Morimoto | 432/152 |

Primary Examiner—Henry A. Bennett
Assistant Examiner—Jiping Lu
Attorney, Agent, or Firm—Beveridge, DeGrandi, Weilacher & Young, LLP

[57] ABSTRACT

The vertical heat treatment apparatus according to the present invention in which a substrate holder holding a plurality of substrates-to-be-processed at a vertical interval is mounted on the top of a cap for opening and closing the bottom opening (furnace throat) of a vertical heat treatment furnace through a heat insulation structure for a heat treatment in the uniform heat region in the furnace, the heat insulation structure comprising support rods for supporting the substrate holder, and a plurality of thin heat insulation plates having insertion holes in which the support rods are loosely inserted in, and supported by the support rods, separated from each other by spacers at a prescribed interval in the direction of height of the support rods, whereby the heat insulation structure can have a simple structure and have decreased heat capacities, and throughput can be improved.

18 Claims, 8 Drawing Sheets

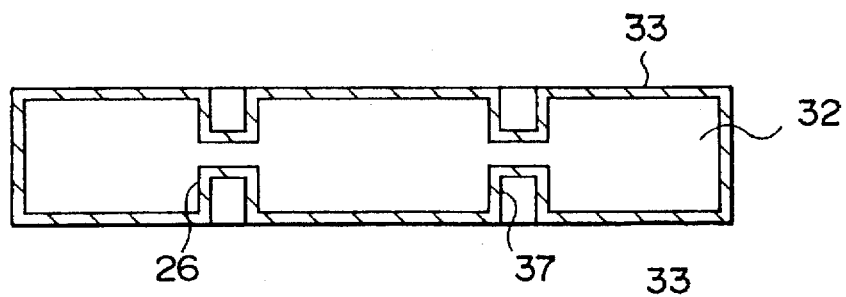
FIG. 7A
FIG. 7B
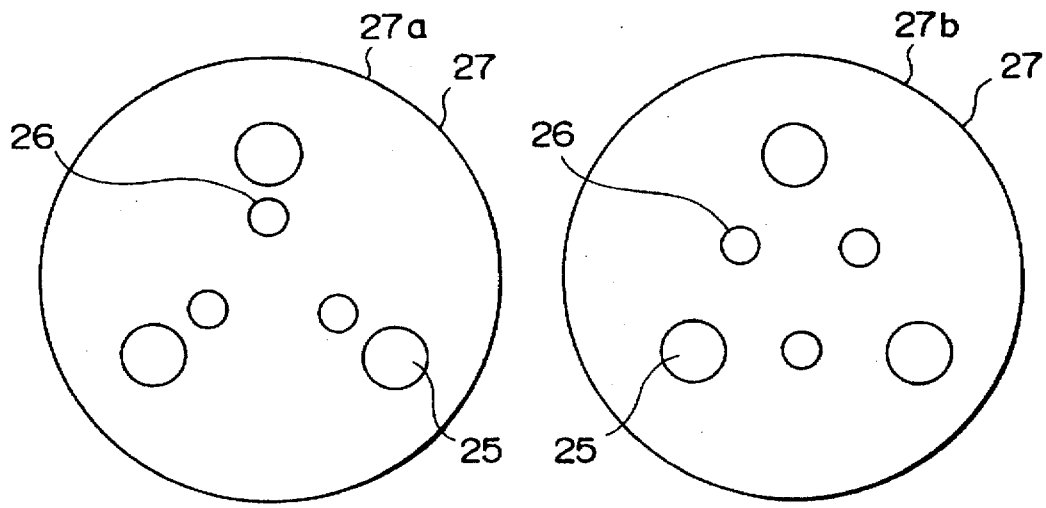
FIG. 8A          FIG. 8B
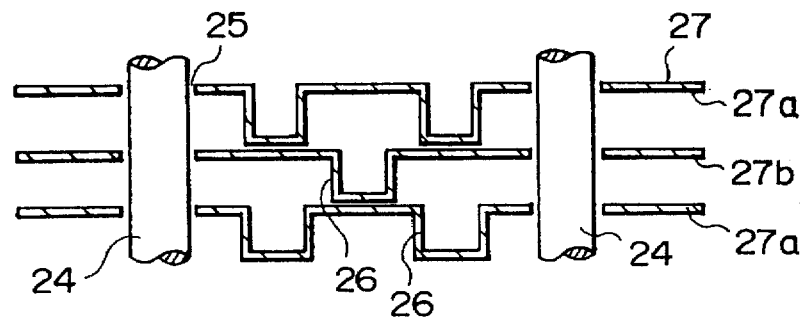
FIG. 9

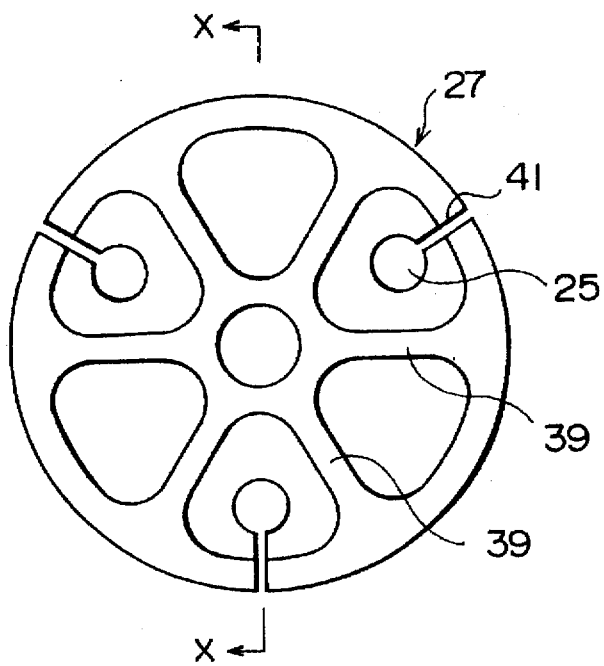
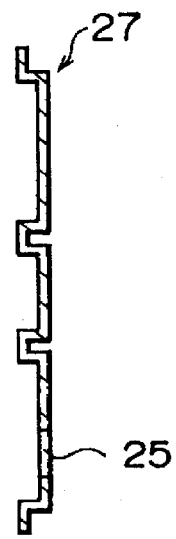
FIG. 10A  FIG. 10B
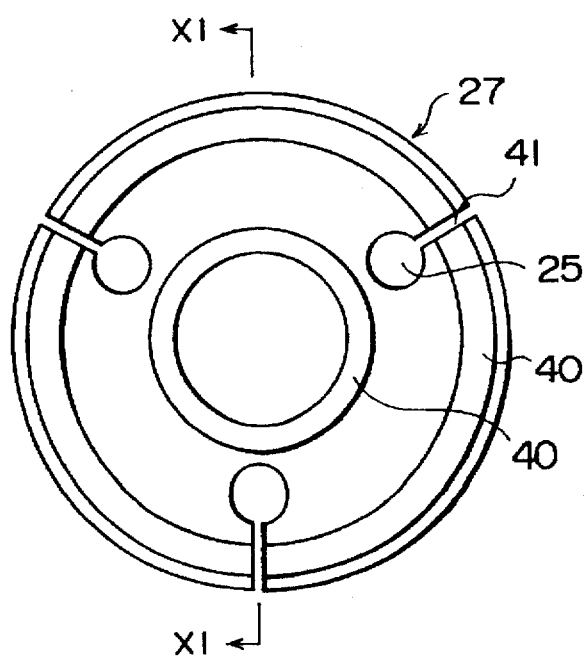
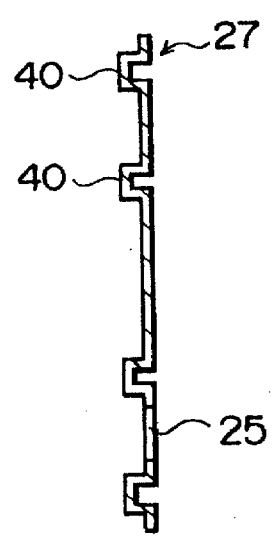
FIG. 11A  FIG. 11B

VERTICAL HEAT TREATMENT APPARATUS

BACKGROUND OF THE INVENTION

The present invention relates to a vertical heat treatment apparatus for semiconductor devices.

In fabrication of semiconductor devices, various heat treatment apparatuses are conventionally used for oxidation, diffusion, CVD (Chemical Vapor Deposition), annealing, etc. In the vertical heat treatment apparatus of such heat treatment apparatuses, which can conduct batch processing of a number of wafers, as shown in FIGS. 15 and 16, a wafer boat 15 as a cap/support body which holds a number of wafers W horizontal at a vertical interval on a cap 13 which opens/closes a bottom opening (throat) of a longitudinal heat treatment furnace 4 with a heater 9 disposed around the outside thereof is mounted on the cap 13 through a heat insulation structure 16, whereby the heat insulation structure 16 blocks escape of heat to below the wafer boat 15 while permitting the wafers W at the furnace core of the heat treatment furnace for heat treatment of the wafers W in the uniform heat region. The heat insulation structure 16 of the vertical heat treatment apparatus of FIG. 15 is in the form of a fin structure 16a including, on a receiver 17 provided on the cap 13, a plurality of stages of fin units 52 each comprising, e.g., four spacer rods 50 and a heat insulation fin 51 disposed on the top of the spacer rods 50. A hole 53 is formed in the central part of the uppermost heat insulation fin (also called a top board), and a projection 54 on the lower end of the wafer boat 15 inserted into the hole 53 for the wafer boat 15 to be supported.

In the heat insulation structure 16a of the vertical heat treatment apparatus of FIG. 16, fin structures 16a, and a hollow container 153 covering the fin structures 16a are mounted on a receiver 17, and the wafer boat 15 is mounted on the top of the hollow container 153.

But the conventional vertical heat treatment apparatus of FIG. 15, in which the wafer boat 15 is supported by the fin structure 16a as the heat insulation structure, has a strength limitation related to a reduction in thickness of the heat insulation fins 51 of the fin units 52 constituting the fin structure 16a. The top board 51a must be especially thick to have sufficient mechanical strength. The heat insulation fins 51 are prepared by grinding sintered bodies of quartz or other equivalent material. But machining the heat insulation fins 51 is difficult, and presently about a 3 mm-thickness is a limit.

Accordingly, the heat insulation structure 16 has a large heat capacity and has a limit to improving throughputs by rapid temperature increase and decrease. The fin structure 16a can adjust the heat insulating effect by changing a number of the steps of the fin units 52. But in changing a number of steps of the fin units 52, a height of the spacer rods 50 must be adjusted so as not to change the set position of the wafer boat 15. Accordingly, several kinds of the spacer rods having different height must be prepared.

On the other hand, in the heat treatment apparatus of FIG. 16, the wafer boat 15 is supported by the hollow containers 153 constituting a part of the heat insulation structure 16. In this arrangement, a number of stages of the fin units 52 can be changed while the set position of the wafer boat 15 is fixed, thus allowing the heat insulation effect to be adjusted in accordance with heat treatment temperatures.

But the heat treatment apparatus needs the fin structure 16a in addition to the hollow container 153, which makes the structure of the heat insulation body 16 more complicated. The assembly and disassembly of the heat insulation body 16 involves substantial labor. The heat insulation structure 16 tends to have increasing heat capacities. A diameter of the heat insulation fins 15 is restricted by the size of the inside wall of the hollow container 153, which imposes a design upper limit to improving the heat insulation.

SUMMARY OF THE INVENTION

The present invention was made to solve the above-described disadvantages. An object of the present invention is to provide a vertical heat treatment apparatus which comprises a heat insulation structure having a simple structure and small heat capacities, and which can improve throughputs.

To achieve the above-described object, the vertical heat treatment apparatus according to the present invention in which a substrate holder holding a plurality of substrates-to-be-processed at a vertical interval is mounted on the top of a cap for opening and closing the bottom opening (furnace throat) of a vertical heat treatment furnace through a heat insulation structure for a heat treatment in the uniform heat region in the furnace, the heat insulation structure comprising support rods for supporting the substrate holder, and a plurality of thin heat insulation plates having insertion holes in which the support rods are loosely inserted in, and supported by the support rods, separated from each other by spacers at a prescribed interval in the direction of height of the support rods.

The vertical heat treatment apparatus according to the present invention has a structure in which the support rods, which are a member of the heat insulation structure, directly support the substrate holder, and with the support rods loosely inserted in the insertion holes in the heat insulation plates, the heat insulation plates are stacked in a plurality of stages, separated by the spacers. Accordingly the structure of the heat insulation structure is simple, the heat insulation plates can be easily removed from the support rods, and its assembly and disassembly/cleaning are easy. A load of the substrate holder is not applied directly to the heat insulation plates, so that the heat insulation plates can have low mechanical strength, and can be thin and have a decreased heat capacity with a result that quick temperature increase decrease are possible, and higher throughputs can be achieved. The heat insulation plates can have a maximum diameter which is allowed by the inner tube of the heat treatment furnace, whereby the heat insulation can be improved. A number of stages of the heat insulation plates can be changed with the substrate holder set in position by the support rods, whereby the heat insulation effect can be adjusted in accordance with heat treatment temperatures.

BRIEF DESCRIPTION OF THE DRAWINGS

FIGS. 7A and 7B are vertical sectional views of the heat insulation plate in the steps of further another method for forming the same.

FIGS. 8A and 8B are plan views of the heat insulation plate having the spacers formed on different positions.

FIG. 9 is a diagrammatical vertical sectional view of the stacked heat insulation plates.

FIGS. 10A and 10B are views of a modification of the heat insulation plate, FIG. 10A being a plan view thereof, and FIG. 10B being a vertical sectional view thereof along the X—X line in FIG. 10A.

FIGS. 11A and 11B are views of another modification of the heat insulation plate, FIG. 11A being a plan view thereof, and FIG. 11B being a vertical sectional view thereof along the XI—XI line.

DETAILED DESCRIPTION OF THE PREFERRED EMBODIMENTS

Figure 1:
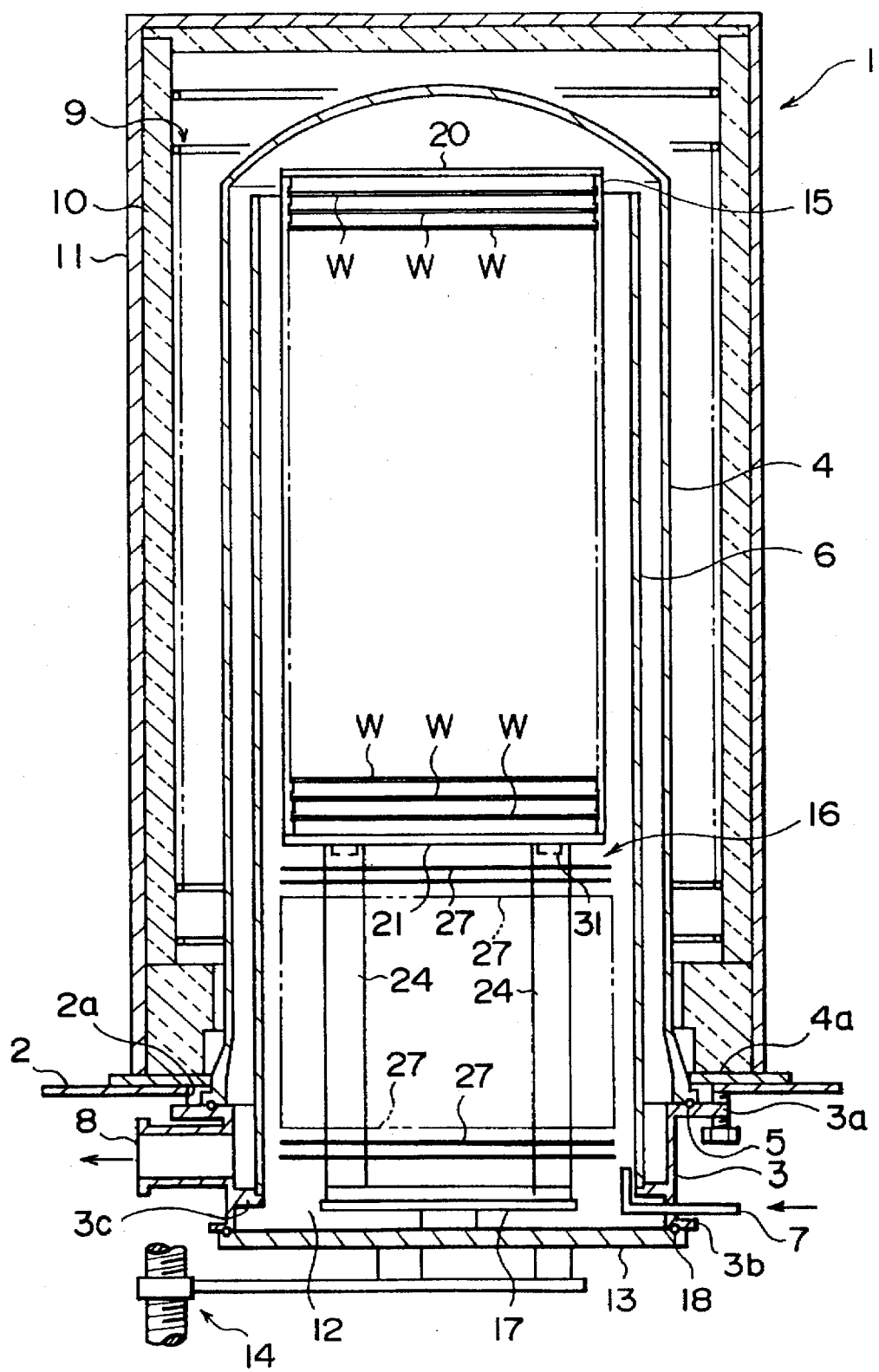
FIG. 1 is a vertical sectional view of the vertical heat treatment apparatus according to the present invention, which diagrammatically shows a general structure thereof.

An embodiment of the vertical heat treatment apparatus according to the present invention will be explained with reference to the drawings attached hereto. The vertical heat treatment apparatus according to the present embodiment is diagrammatically shown in FIG. 1. The vertical heat treatment apparatus according to the present embodiment is applicable to the film deposition on substrates to be processed, e.g., semiconductor wafers W, by low-pressure CVD. The vertical heat treatment apparatus 1 includes a base plate 2 of, e.g., stainless steel, disposed parallel with the floor. The base plate 2 has a circular machined portion 2a in the center thereof and is supported by a frame or other means (not shown).

A cylindrical manifold 3 of, e.g., stainless steel having flanges 3a, 3b projected radially outward respectively from the upper and the lower ends thereof is disposed below the base plate 2. A process tube of a heat resistant and corrosion resistant material, e.g., quartz, which constitutes an elongated heat treatment furnace is air-tightly connected to the manifold 3 through an O-ring 5.

The process tube 4 has the upper end closed and the lower end opened, and has an outward flange 4 on the lower end thereof. An inner tube 6 of quartz having the upper and the lower ends thereof opened is disposed conically inside the process tube 4 with the lower end engaged with the flange 3c. Thus the vertical heat treatment furnace of the double tube structure is constituted.

A plurality of feed pipes 7 for introducing a processing gas and an inert gas into the process tube 4 from a processing gas source and an inert gas source (not shown). An exhaust pipe 8 is disposed in the process tube 4 for evacuating the interior of the process tube 4 to, e.g., $10-10^{-8}$ Torr by evacuation means now shown, such as a vacuum pump or others.

Around the process tube 4 there is disposed a heater 9 in the form of, e.g., a coil of a heating wire (resistant heater), such as kanthal wires or others, for heating the interior of the process tube 4 to, e.g., 400–1200° C. The outside of the heater 9 is covered with, through a heat insulating material 10, an outer shell 11 of stainless steel in the form of a cooling jacket. Thus, a hot-wall type heating furnace is formed. The heater 9, the heat insulating material 10 and the outer shell 11 are supported on the base plate by suitable means.

Below the manifold 3 there is provided a cap 13 of, e.g., stainless steel, which opens and closes the bottom opening thereof, i.e., the bottom opening 12 of the heat treatment furnace and which is moved up and down by a lift mechanism 14 as a loading mechanism. A wafer boat 15 of, e.g., quartz, as a substrate holder for holding a plurality, e.g., 30–150 sheets, of wafers W on a plurality of stages horizontal at a prescribed vertical interval is mounted on the cap 13 through a heat insulation structure 16 of, e.g., quartz.

Figure 2:
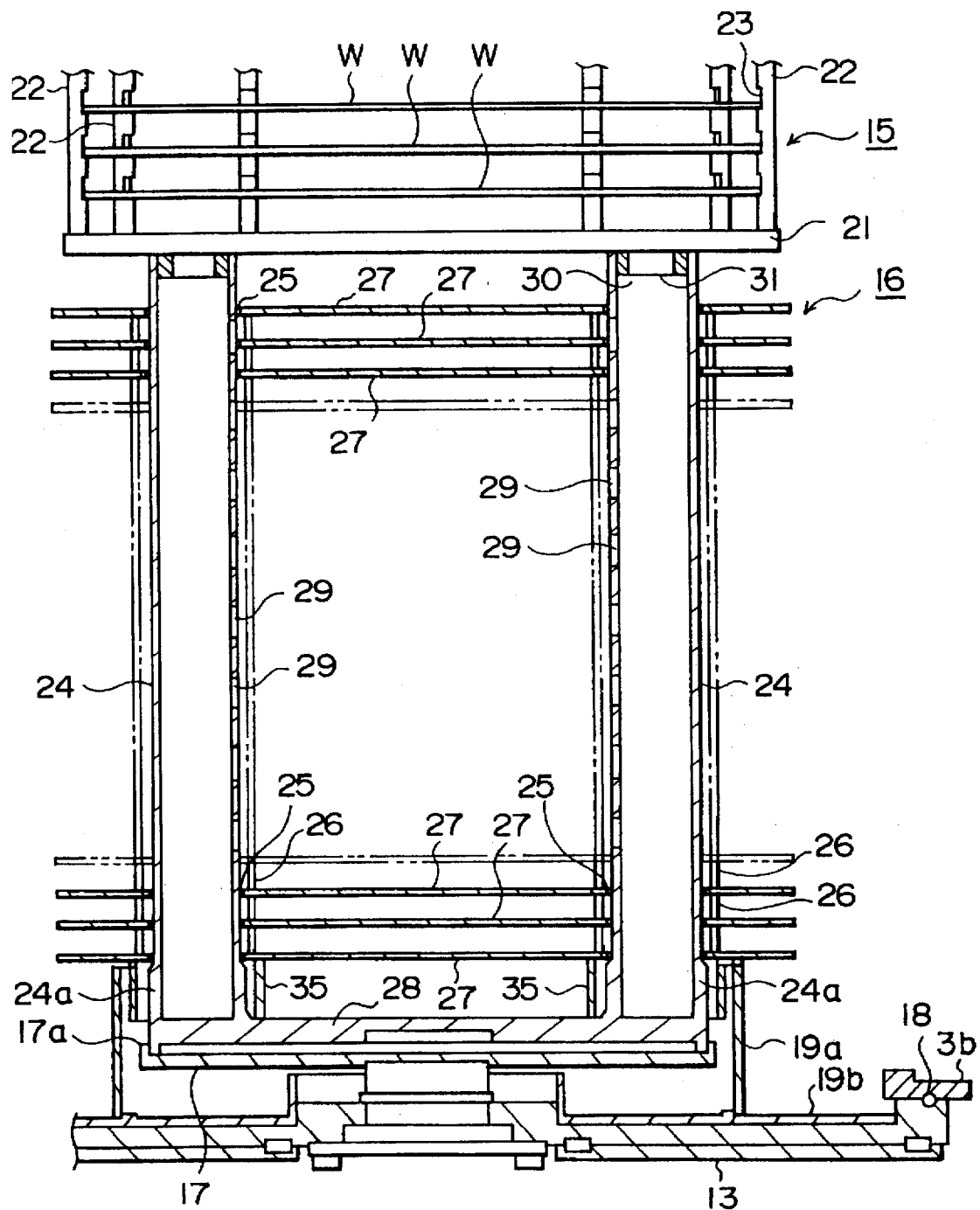
FIG. 2 is a vertical sectional view of the heat insulation structure of the vertical heat treatment apparatus of FIG. 1.

Above the cap 13 there is provided a receiver 17 on which the heat insulation structure 16 is mounted. As shown in FIG. 2, an edge 17a for restricting horizontal (radial) displacement of the heat insulation structure 16 is formed on the periphery of the receiver 17. Preferably the receiver 17 is rotated by rotary drive means for homogeneous heat treatment of the wafers W but may be unrotatable. An O-ring 18 is provided between the cap 13 and the manifold 3 for air-tight sealing therebetween, and a heat insulation members 19a, 19b of, e.g., quartz are disposed, surrounding the inside surface of the cap 13 and the receiver 17 (FIG. 2).

As shown in FIGS. 1 and 2, the wafer boat 15 comprises a plurality of rod-shaped vertical frames 22 bridging the upper and the lower end plates 20, 21 and arranged, surrounding disc-shaped wafers W, and grooved locking portions 23 which are provided in the vertical frames 22 for supporting horizontal a plurality of wafers W, e.g., about 150 sheets, on plural stages at a prescribed vertical (height-wise) interval. The vertical frame 22 has one side opened to permit the wafers W to be transferred therethrough horizontally by a transfer mechanism (not shown). The transfer mechanism has a tongue-shaped transfer arm, and the transfer arm carries one or several sheets of wafers W to transfer the wafers W to the wafer boat 13, etc. in a transfer area positioned which is lower than the process tube 4.

Figure 3:
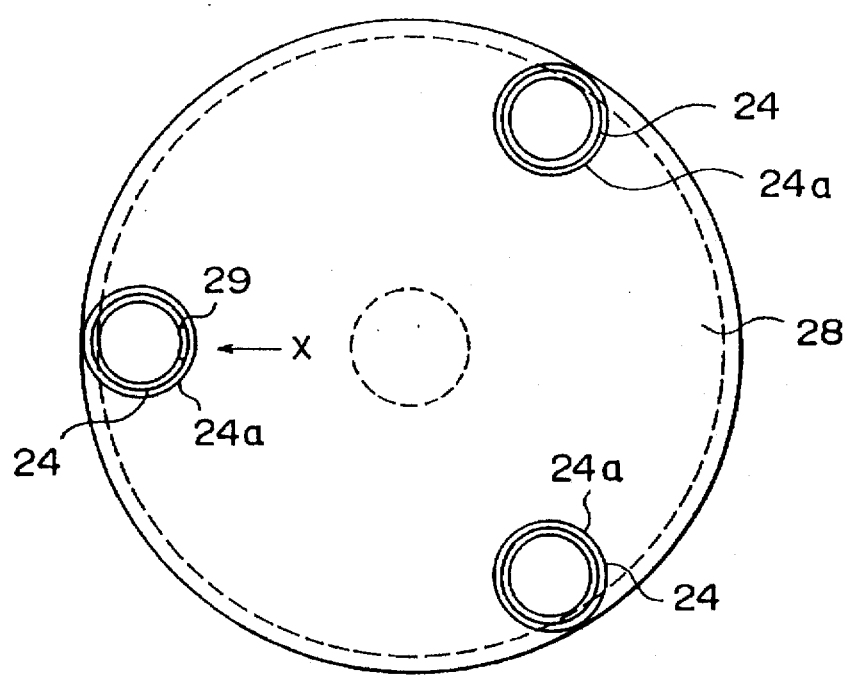
FIG. 3 is a plan view of the base having the support rods of the heat insulation structure of FIG. 2.

On the other hand, as shown in FIG. 2, the heat insulation structure 16 comprises support rods 24 which support the wafer boat 15, and a plurality of thin heat insulation plates 27 having insertion holes in which the support rods 24 are loosely inserted and which are supported by the support rods 24. The thin insulation plates are spaced from each other by a prescribed vertical interval by spacers 26 arranged at a prescribed interval in the direction of height of the support rods 24. For stable support of the wafer boat 15 by the heat insulation structure 6, the support rods 24 have a disc-shaped base 28 which is to be mounted on the receiver 17, and a plurality, 3 as exemplified in FIG. 3, of the support rods are erected on the base 28. The support rods 24 and the base 28 are formed of a heat resistant material, e.g., quartz, more preferably a heat insulating opaque quartz or sand-blasted quartz in one piece or connected to each other by silicon impregnation or suitable equivalents.

Figure 4:
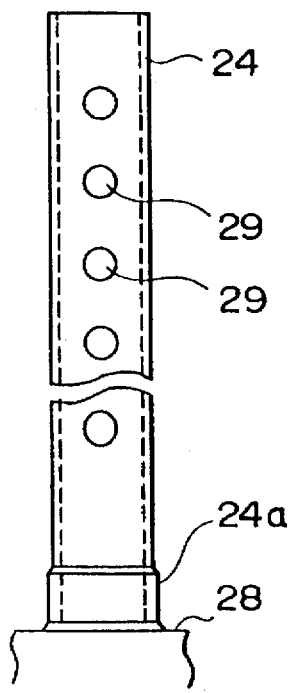
FIG. 4 is a side view of the support rods on the base in the X-direction in FIG. 3.

The support rods 24 are formed in a hollow cylinder for improving handling, ensuring rigidity and decreasing heat capacities by lightening the heat insulation structure 16. For improvement of evacuation in low pressure heat treatments, as shown in FIG. 4, air vent holes 29 which communicate the interior with the outside are formed in the support rod(s) 24 on one side (or both sides) at a prescribed vertical interval.

As shown in FIG. 2, to reduce a heat capacity by omitting excessive members, such as the top board, etc. for supporting the wafer boat 15 from the upper part of the heat insulation structure 16, on the undersides of the lower end plate 21 of the wafer boat 15 there are formed a plurality of engagement convexities 31 which are engaged in to openings 30 of the support rods 24. The engagement portions in the lower end plate 21 of the wafer boat 15 may be concavities in which the upper ends of the support rods 24 are engaged.

Figure 5A:
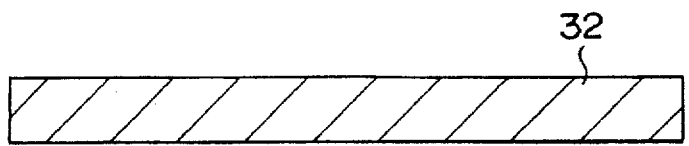
FIGS. 5A to 5C are vertical sectional views of the heat insulation plate of the heat insulation structure of FIG. 2 in the steps of a method for forming the same.
Figure 5B:
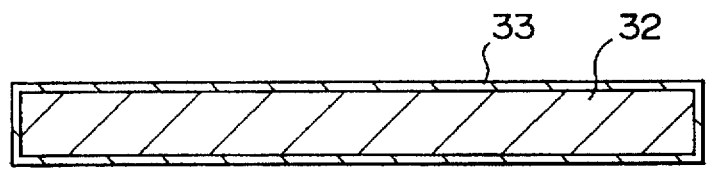

The heat insulation plates 27 are formed of silicon carbide film (SIC) of a prescribed thickness, e.g., a 0.2–0.8 mm formed by CVD for reducing heat capacities by thinning the heat insulation plates 27. In forming the heat insulation plates 27 by CVD, a disc-shaped or a plate-shaped section 32 of a material which can be burnt off or solved off is prepared as exemplified in FIG. 5A. Silicon carbide film 33 is formed in a prescribed thickness on the surfaces of the sections by CVD using SiC raw material gases (e.g., lost wax process) as shown in FIG. 5B. As the material which can be burnt off, carbon, synthetic resin or others is usable. As the material which can be solved off, a metal, such as aluminium, which can be solved by acid, or synthetic resin or others, which can be solved by an organic solvent is usable.

Figure 5C:
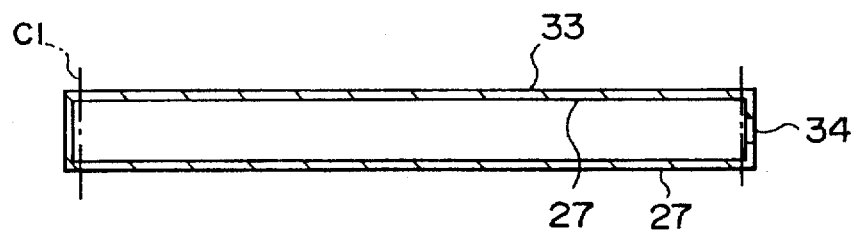

Then, as shown in FIG. 5C, the section 32 is burnt off or solved off to obtain a hollow body of the silicon carbide film 33. The hollow body is cut into shapes of a prescribed size (indicated by C1) to prepare two sheets of the heat insulation plates 27. When the section 32 is burnt off or solved off, an opening 34 is formed in the silicon carbide film 33, and the section 32 is discharged through the opening 34 as gases or liquids generated by the burning or solution.

The heat insulation plates 27 are formed in a disc having a diameter substantially equal to or a little larger than a diameter of the wafers W. As shown in FIG. 2, insertion holes 25 which are a little larger than a diameter of the support rods 24 are formed in parts thereof corresponding to the support rods 24. The spacers 26, which form a prescribed interval between the heat insulation plates 27 from each other are formed of, e.g., silicon carbide and loosely inserted in the support rods 24 between the heat insulation plates 27. It is preferable in consideration of interior environments of the heat treatment furnace that an interval between the heat insulation plates 27 is substantially the same as that between the wafers W. As shown in FIG. 2, a spacer 35 is disposed between the lowermost heat insulation plate 27 and the base 28. The spacers 26 include ventilation holes positionally corresponding to the vent holes 29 in the support rods 24.

Figure 6A:
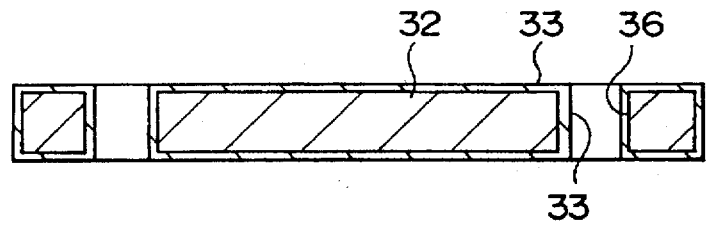
FIGS. 6A and 6B are vertical sectional views of the heat insulation plate in the steps of another method for forming the same.
Figure 6B:
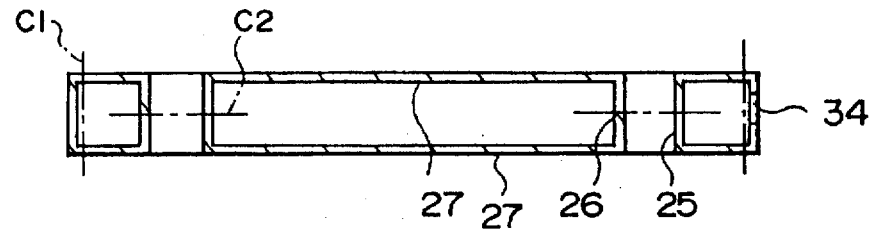

The spacers 26 may be formed integral with the heat insulation plates 27. In forming the heat insulation plates 27 integrated with the spacers 26, as exemplified in FIG. 6A, a section 32 with holes 36 of a diameter corresponding to the support rods 24 is prepared. Silicon carbide film 33 is formed on the surface of the section 32. The silicon carbide film 33 is formed also on the inside surface of the holes 36. Then as shown in FIG. 6B, the section 32 is burnt off or solved off, and the silicon carbide film 33 is cut in a prescribed size (indicated by C1) and is cut thickness-wise into two (indicated by C2) to prepare two sheets of the heat insulation plates integrated with the spacers 26. By thus integrating the spacers 26 with the heat insulation plates 27, a member number can be accordingly decreased, and generation of particles at the contacts between the members can be suppressed.

The spacers 26 are not necessarily formed around the insertion holes 25 to receive the support rods and may be formed as spacer rods suitably in the plane of heat insulation plates 27. In forming the heat insulation plates 27 with the spacers 26 in a rod shape, as shown in FIG. 7A, a section 32 having blind holes 37 is prepared, and silicon carbide film 33 is formed on the surface of the section 32. The spacers 26 in the shape of a rod are formed in conformity with the inside surfaces of the blind holes 37.

Then, the section 32 is burnt off or solved off, and the hollow body of the silicon carbide film 33 as shown in FIG. 7B is obtained. The hollow body is cut as indicated by C1, and then the insertion holes 25 for the support rods to be passed through are opened.

In using the heat insulation plates 27 with such rod-shaped spacers 26, as shown in FIGS. 8A and 8B, two kinds 27a, 27b of the heat insulation plates 27, which are different from each other in the position of the rod-shaped spacers 26 are prepared. The heat insulation spacers 27a, 27b are alternately stacked as shown in FIG. 9. This is because when the heat insulation plates of the same kind are stacked on one another, the rod-shaped spacers 26 formed in the blind holes block the hollow portions with a result that the hollow portion is not well evacuated.

In the vertical heat treatment apparatus having the above-described structure, as shown in FIG. 1, the cap 13 is lowered by the lift mechanism (boat elevator) 14 to the transfer area located below the process tube 14, and wafers W are transferred by another transfer mechanism to the wafer boat 15 mounted on the cap 13 through the heat insulation structure 16. Then the cap 13 is lifted by the lift mechanism 14 to carry the wafer boat 15 and the heat insulation structure 16 into the process tube 4, the cap 13 being brought into abutment on the underside of the lower flange 3b of the manifold 3, and the process tube 4 is tightly closed. Thus, the wafer boat 15 is positioned in the uniform heat region in the furnace.

Then, the interior of the process tube 4 is evacuated through the exhaust pipe 8, and an inert gas, e.g., nitrogen ($N_2$) gas, is introduced into the process tube through the feed pipe 7 to purge the interior of the process tube 4 with, the nitrogen gas. Then, the wafers are heated by the heater 9 quickly to a prescribed processing temperature. A prescribed processing gas is fed into the process tube 4 through the feed pipe 7 while the interior of the process tube is maintained at a prescribed lower pressure. A heat treatment, such as deposition, is conducted on the substrates to be processed (wafers W). When the heat treatment is over, the temperature of the wafers are lowered quickly to, e.g., the room temperature and carried on the wafer boat 15 outside the process tube 4.

The vertical heat treatment apparatus 1 according to the present invention has a structure in which the support rods 24 which comprise a member of the heat insulation structure 16, directly support the wafer boat 15. With the support rods 24 loosely inserted in the insertion holes 25 in the heat insulation plates 27, the heat insulation plates 27 are stacked in a plurality of stages, separated by the spacers 26. Accordingly the structure of the heat insulation structure 16 is simple, the heat insulation plates 27 can be easily removed from the support rods 24, and its assembly and disassembly/cleaning are easy. A load of the wafer boat 15 and the wafers W is not applied directly to the heat insulation plates 27, so that the heat insulation plates 27 can have low mechanical strength, and can be thin and have a decreased heat capacity with a result that quick temperature increase and decrease are possible, and higher throughputs can be achieved.

In the vertical heat treatment apparatus 1 according to the present invention, the heat insulation plates 7 can have a maximum diameter which is allowed by the inner tube 6 of the heat treatment furnace, whereby the heat insulation can be improved. A number of stages of the heat insulation plates 27 can be changed with the wafer boat 15 set in position by the support rods 24, whereby the heat insulation effect can be adjusted in accordance with heat treatment temperatures.

In the vertical heat treatment apparatus 1 according to the present invention, as shown in FIG. 2, the support rods 24 have the base 28 which is to be mounted on the receiver 17 disposed on the top of the cap 13, and the support rods 24 are erected on the base 28, whereby the wafer boat 16 can be stably supported by the heat insulation structure 16. The support rods 24 are formed hollow and have the vent holes 29 in the sides thereof, whereby the heat insulation plates 16 are lightened with results that the handling is improved, the strength is secured, and smaller heat capacities can be obtained. Gas molecules in the support rods 24 can be efficiently discharged through a plurality of the vent holes 29 in the sides of the support rods 24, whereby the evacuation in low-pressure heat treatments can be improved.

As shown in FIG. 2, the engagement convexities 31 which are engaged with the top end of the support rods 24 are provided on the lower end plate 21 at the lower end of the wafer boat 15, whereby extra members, such as a top board, etc., for supporting the wafer boat 15 are not necessary on an upper part of the heat insulation plates 16. The heat insulation structure 16 can be simple, can have further smaller heat capacities, and can stably support the wafer boat 15. The heat insulation plates 27 are formed of silicon carbide film formed by CVD, whereby the heat insulation plates 27 can be thinner, and can have further smaller heat capacities.

FIGS. 10A and 10B, and FIGS. 11A and 11B show variations of the heat insulation plate. The heat insulation plate shown in FIGS. 10A and 10B has radial and raised ribs or reinforcing portions 39, and the heat insulation plate shown in FIGS. 11A and 11B has conical (ring-shaped) and raised ribs or reinforcing portions 40. Both have sections having the raised portions. The heat insulation plates of such sectional shapes having the respective raised portions are allowed to reduce their thickness while ensuring rigidity. Slits 41 are suitably formed in the peripheral edge of the heat insulation plates 27 for preventing the heat insulation plates from being damaged by thermal stresses. Preferably the slits 41 are formed radially in the heat insulation plates but may be formed circumferentially in the heat insulation plates.

Figure 12:
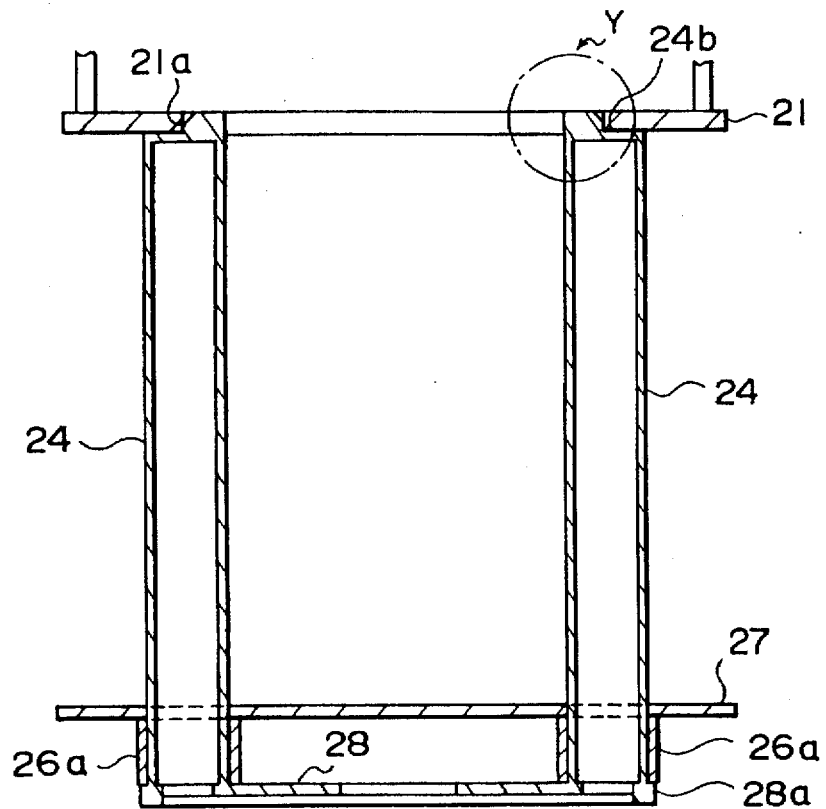
FIG. 12 is a vertical sectional view of another modification of the heat insulation structure.
Figure 13:
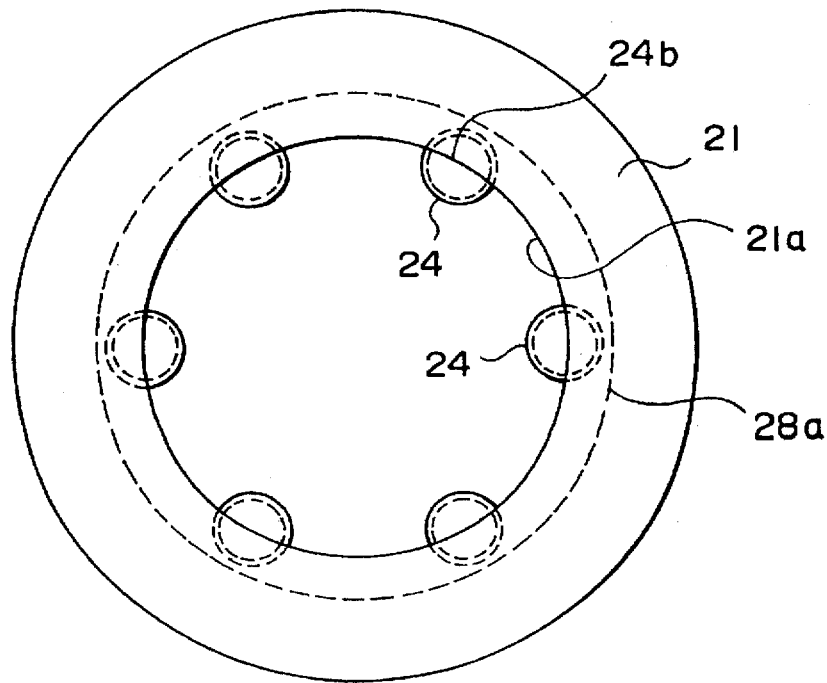
FIG. 13 is a plan view of the heat insulation structure of FIG. 12 as viewed from above.
Figure 14:
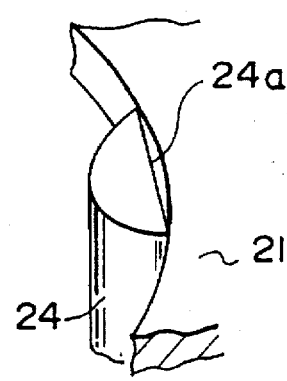
FIG. 14 is an enlarged perspective view of the cut-off portion of the support rod of the heat insulation structure of FIG. 13.
Figure 15:
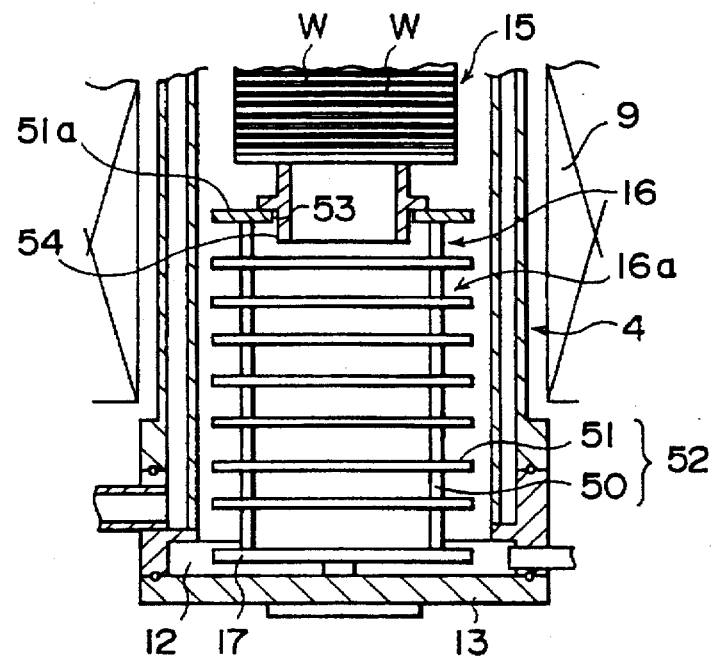
FIG. 15 is a vertical sectional view of the heat insulation structure of the conventional vertical heat treatment apparatus.
Figure 16:
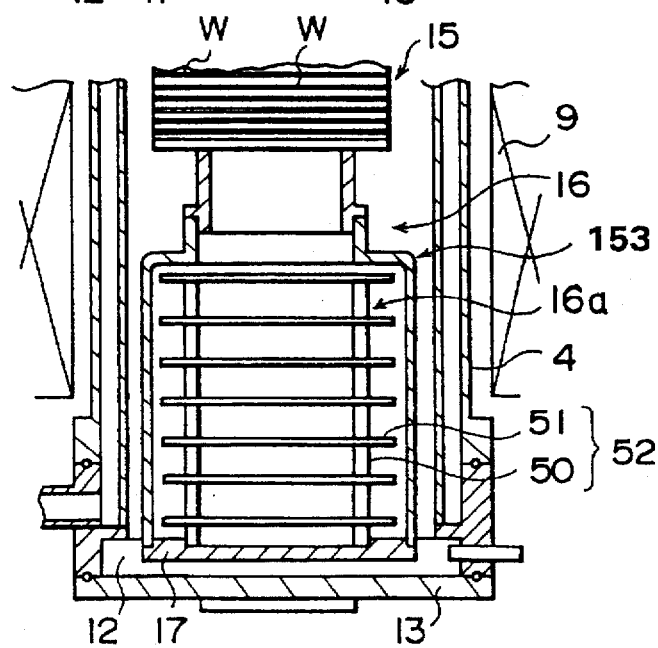
FIG. 16 is a vertical sectional view of the modification of the heat insulation structure of the vertical heat treatment apparatus.

As exemplified in FIGS. 12 to 14, six support rods 24 are arranged circumferentially equidistant from each other and are solid. Radially outward portions of the tops of the support rods 24 are cut off to form cut-off portions 24a. The cut-off portions 24a may be engaged in the inner circumference of the lower end plate 21 of the wafer boat 15. In this case, the heat insulation plates 27 are vertically spaced from each other by the spacers 26a.

The vertical heat treatment apparatus according to the present invention is not limited to the above-described embodiment and can cover various modifications falling within the scope of the gist of the present invention. For example, in the above-described embodiment, the hollow spacers are passed through the support rods, but the spacers are essentially hollow and can be passed through the support rods. A material of the spacers may be quartz other than silicon carbide. Preferably the heat insulation plates are formed of silicon carbide by CVD, but the silicon carbide may be formed by chemically reacting a thin plate of graphite with silicon oxide (SiO).

It is preferred that a material of the heat insulation plates is silicon carbide, but may be quartz as long as thinning of quartz can be technically solved. In this case, quartz is preferably heat insulating opaque quartz or sand blast quartz. The vertical heat treatment apparatus according to the present invention is applicable to heat treatments, such as oxidation, diffusion, annealing, etc. in addition to CVD. Substrates to be processed may be, e.g., LCD substrates, etc. in addition to semiconductor wafers.

What is claimed is:

1. A vertical heat treatment apparatus for heat treating objects to-be-process in a heat uniform heating region in a heat treatment furnace, comprising:

a cap for opening and closing a furnace opening of a heat processing furnace;

a heat insulation structure mounted on the cap; and a substrate holder for supporting a plurality of substrates to-be-processed on the heat insulation structure at a vertical interval, wherein the heat insulation structure comprises a plurality of upright support rods for supporting the substrate holder and a plurality of thin heat insulation plates having insertion holes through which the support rods are inserted, and where each of said thin heat insulating plates are separated by spacers at a vertical interval.

2. The vertical heat treatment apparatus according to claim 1, wherein the rods have a circular base which is to be mounted on a receiver disposed on an upper end of the cap, and said plurality of rods are erected on the base.

3. The vertical heat treatment apparatus according to claim 1, wherein the rods have hollow portions in the centers thereof, and a plurality of vent holes are formed in one or both sides thereof.

4. The vertical heat treatment apparatus according to claim 3, wherein convex engagement portions projected from a lower end of the substrate holder are engaged in hollow portions of the support rods.

5. The vertical heat treatment apparatus according to claim 1, wherein the substrate holder has an engagement portion on a lower end thereof, and said engagement portion is engaged with an upper end of a below positioned one of said rods.

6. The vertical heat treatment apparatus according to claim 1, wherein the support rods are solid and have cut-off portions which are engaged in an inner circumference of the substrate holder.

7. The vertical heat treatment apparatus according to claim 1, wherein the heat insulation plates are formed of silicon carbide film produced by a chemical vapor deposition process.

8. The vertical heat treatment apparatus according to claim 1, wherein the heat insulation plates have sectional shapes having raised portions.

9. The vertical heat treatment apparatus according to claim 1, wherein the rods have hollow portions in the centers thereof.

10. The vertical heat treatment apparatus according to claim 1, wherein the rods have an internal hollow passageway and a plurality of vent holes.

11. The vertical heat treatment apparatus according to claim 1 wherein said plurality of thin heat insulation plates include a top plate, a bottom plate and a plurality of intermediate plates, and between each of said heat insulation plates is an open, air filled space.

12. The vertical heat treatment apparatus according to claim 1 wherein said vertical spacers are cylindrical spacers through which the support rods extend.

13. A vertical heat treatment apparatus for heat treating objects to be processed in a uniform heat region in a heat treatment furnace, comprising:

a cap for opening and closing a furnace throat of a heat processing furnace;

a heat insulation structure mounted on the cap; and a substrate holder for supporting a plurality of substrates to be processed on the heat insulation plates at a vertical interval, wherein the heat insulation structure comprising a plurality of upright support rods for supporting the substrate holder; and a plurality of thin heat insulation plates having insertion holes in which the support rods are inserted, said thin heat insulation plates being separated by spacers at a vertical interval, and wherein the rods have a hollow portion and a plurality of vent holes which open into said hollow portion formed therein.

14. The vertical heat treatment apparatus according to claim 13 wherein said plurality of thin heat insulation plates include a top plate, a bottom plate and a plurality of intermediate plates, and between each of said heat insulation plates is an open, air filled space.

15. The vertical heat treatment apparatus according to claim 13 wherein said vertical spacers are cylindrical spacers through which the support rods extend.

16. A vertical heat treatment apparatus for heat treating objects to be processed in a uniform heating region in a heat treatment furnace, comprising:

a cap for opening and closing a furnace opening of a heat processing furnace;

a heat insulation structure mounted on the cap; and a substrate holder for supporting a plurality of substrates to-be-processed on the heat insulation structure at a vertical interval, wherein the heat insulation structure comprises a plurality of upright support rods for supporting the substrate holder and a plurality of thin heat insulation plates having insertion holes through which the support rods are inserted, and where each of said thin heat insulation plates are separated by spacers at a vertical interval, and wherein said support rods are loosely received in the insertion holes of said thin heat insulation plates and a plurality of said spacers are supported by a below positioned one of said thin heat insulation plates and said plurality of said spacers support an above positioned one of said thin heat insulation plates.

17. The vertical heat treatment apparatus according to claim 16 wherein said plurality of thin heat insulation plates include a top plate, a bottom plate and a plurality of intermediate plates, and between each of said heat insulation plates is an open, air filled space.

18. The vertical heat treatment apparatus according to claim 16 wherein said vertical spacers are cylindrical spacers through which the support rods extend.

* * * * *